(12) United States Patent
Mei et al.

(10) Patent No.: US 6,970,020 B1
(45) Date of Patent: Nov. 29, 2005

(54) HALF-RATE LINEAR QUARDRATURE PHASE DETECTOR FOR CLOCK RECOVERY

(75) Inventors: Haitao Mei, Kanata (CA); Shoujun Wang, Nepean (CA); Mashkoor Baig, Ottawa (CA); Bill Bereza, Nepean (CA); Tad Kwasniewski, Ottawa (CA)

(73) Assignee: Altera Corporation, San Jose, CA (US)

( * ) Notice: Subject to any disclaimer, the term of this patent is extended or adjusted under 35 U.S.C. 154(b) by 9 days.

(21) Appl. No.: 10/739,446

(22) Filed: Dec. 17, 2003

(51) Int. Cl.$^7$ ............................................. G01R 25/00
(52) U.S. Cl. ............................. 327/3; 327/2; 327/244
(58) Field of Search ................................ 327/2, 3, 5, 7, 327/10, 238, 243, 244, 254; 375/375; 331/25

(56) References Cited

U.S. PATENT DOCUMENTS

| | | | |
|---|---|---|---|
| 3,473,160 A | 10/1969 | Wahlstrom | 326/41 |
| 4,486,739 A | 12/1984 | Franaszek et al. | 341/59 |
| 5,014,316 A * | 5/1991 | Marrah et al. | 381/15 |
| 5,689,195 A | 11/1997 | Cliff et al. | 326/41 |
| 5,802,103 A | 9/1998 | Jeong | 326/41 |
| 5,825,209 A * | 10/1998 | Stark et al. | 327/3 |
| 5,909,126 A | 6/1999 | Cliff et al. | 326/41 |
| 6,031,428 A | 2/2000 | Hill | 331/11 |
| 6,100,722 A * | 8/2000 | Dalmia | 327/12 |
| 6,163,208 A * | 12/2000 | Christensen et al. | 329/304 |
| 6,215,326 B1 | 4/2001 | Jefferson et al. | 326/41 |
| 6,225,831 B1 * | 5/2001 | Dalmia et al. | 327/12 |
| 6,320,921 B1 * | 11/2001 | Gu | 375/376 |
| 6,373,293 B1 * | 4/2002 | Best | 327/2 |
| 6,407,576 B1 | 6/2002 | Ngai et al. | 326/41 |
| 6,483,886 B1 | 11/2002 | Sung et al. | 375/376 |
| 6,642,746 B2 * | 11/2003 | Donnelly et al. | 327/3 |
| 6,650,140 B2 | 11/2003 | Lee et al. | 326/39 |
| 6,724,328 B1 | 4/2004 | Lui et al. | 341/101 |
| 2001/0033188 A1 | 10/2001 | Aung et al. | 327/141 |
| 2003/0052709 A1 | 3/2003 | Venkata et al. | 326/37 |
| 2003/0155955 A1 | 8/2003 | Andrasic et al. | 327/277 |

OTHER PUBLICATIONS

U.S. Appl. No. 10/059,014, filed Jan. 29, 2002, Lee et al.
U.S. Appl. No. 10/209,633, filed Jul. 30, 2002, Starr et al.
U.S. Appl. No. 10/273,899, filed Oct. 16, 2002, Venkata et al.
U.S. Appl. No. 10/317,262, filed Dec. 10, 2002, Venkata et al.
U.S. Appl. No. 10/317,264, filed Dec. 10, 2002, Venkata et al.

(Continued)

*Primary Examiner*—Timothy P. Callahan
*Assistant Examiner*—Hai L. Nguyen
(74) *Attorney, Agent, or Firm*—Fish & Neave IP Group of Ropes & Gray LLP; Jeffrey H. Ingerman

(57) ABSTRACT

A half-rate linear phase detector is particularly well-suited to clock data recovery in a serial data interface. The phase detector uses a quadrature clock to process different portions of the incoming data with different phases of the clock. The resulting component signals can be combined to provide the expected UP and DOWN phase detector output control signals. The phase detector output signals are balanced and of uniform width, minimizing oscillator control signal ripple in the clock data recovery circuit, while the linearity of the phase detector makes its output predictable.

8 Claims, 5 Drawing Sheets

OTHER PUBLICATIONS

U.S. Appl. No. 10/349,541, filed Jan. 21, 2003, Venkata et al.
U.S. Appl. No. 10/637,982, filed Aug. 8, 2003, Venkata et al.
U.S. Appl. No. 10/668,900, filed Sep. 22, 2003, Asaduzzaman et al.
U.S. Appl. No. 10/713,877, filed Sep. 26, 2003, Asaduzzaman et al.
U.S. Appl. No. 10/713,877, filed Nov. 13, 2003, Churhill et al.
U.S. Appl. No. 10/722,665, filed Nov. 26, 2003, Wortman et al.
U.S. Appl. No. 10/470,120, filed Dec. 17, 2003, Wang et al.
U.S. Appl. No. 10/739,445, filed Dec. 17, 2003, Kwasniewski et al.
Cook, Barry M., "IEEE 1355 Data-Strobe Links: ATM Speed at RS232 Cost", Microprocessors and Microsystems, Elsevier, UK, vol. 21, No. 7-8, pp. 421-428 (Mar. 30, 1998).
Konstas, Jason, "Converting Wide, Parallel Data Buses to High Speed Serial Links", Cypress Semiconductor, pp. 19-30 (1999).
Lemme, Helmuth, "Schnelle Chips Für Flaschenhäise" Elektonik, Franzis Verlag GMBH. Munchen, DE, vol. 40, No. 22, pp. 104-109 (Oct. 29, 1991).
"Lucent Introduces 10Gb/s Ethernet FPGAs", Programmable Logic News and Views, Electronic Trend Publications, Inc., vol. IX, No. 11, pp. 7-8 (Nov. 2000).
"ORCA ORT82G5 0.622/1.0-1.25/2.0-2.5/3.125 Gbits/s Backplane Interface FPSC", Lucent Technologies, Microelectronics Group, Product Brief, pp. 1-8 (Feb. 2001).
"ORCA ORT82G5 1.0-1.25/2.0-2.5/3.125 Gbits/s Backplane Interface FPSC", Preliminary Data Sheet, Agere Systems Inc., pp. 1-35 (Jul. 2001).
"ORCA ORT8850 Field-Programmable System Chip (FPSC) Eight-Channel x 850 Mbits/s Backplane Transceiver", Data Sheet, Agere Systems Inc., pp. 1-6 (Jul. 2001).
"ORCA ORT8850 Field-Programmable System Chip (FPSC) Eight-Channel x 850 Mbits/s Backplane Transceiver", Product Brief, Agere Systems Inc., pp. 1-6 (Jul. 2001).
"Protocol Independent Gigabit Backplane Transceiver Using Lucent ORT4622/ORT8850 FPSCs", Lucent Technologies, Microelectronics Group, Application Note, pp. 1-10 (Jun. 2000).
"Rocket I/O Transceiver User Guide", UG024 (v1.2), Xilinx, Inc. (Feb. 25, 2002).
"Virtex-II Pro Platform FPGA Handbook", UG012 (v1.0), pp. 1-6, 27-32, 121-126, and 162-180, Xilinx, Inc. (Jan. 31, 2002).
"Virtex-II Pro Platform FPGAs: The Platform for Programmable Systems", <http://www.xilinx.com/virtex2pro> (visited Mar. 5, 2002).

* cited by examiner

HALF-RATE LINEAR QUARDRATURE PHASE DETECTOR FOR CLOCK RECOVERY

BACKGROUND OF THE INVENTION

This invention relates to phase detection in clock data recovery applications. More particularly, this invention relates to a phase detector, for use in clock data recovery, that is predictable and stable.

It is almost axiomatic that digital systems are clocked. For a clock of period T, the clock signal is typically a series of square (or rectangular) pulses of durations T/2, separated by zero-amplitude intervals of durations T/2. Such a clock has a rate or frequency of 1/T. The clock is used to time data signals, with each data pulse having a duration T/2. However, there is no reason why consecutive data pulses need be separated by zero-amplitude intervals. Therefore, two or more (n) consecutive data pulses can be transmitted as a single continuous "high" signal of duration nT. In each clock period T, one data pulse can be transmitted. Thus, the data rate of the system is the same as that of the clock rate. In a double data rate system, data is sampled on both rising and falling clock edges, resulting in a data rate twice that of the clock rate, with each data pulse having a duration T/2.

Because any particular data pulse can be either high ("1") or low ("0"), a train of unknown data pulses is commonly represented by two superposed waves, with the edges of the pulses are not purely vertical, so that the progression of pulses is distinctly visible. Each possible data position thus is shown as both high and low, signifying that either value is possible in a stream of actual data. Because the edges representing the pulse transitions in such a representation are not purely vertical, the intersecting inclined lines give each pulse position the appearance of an eye, and each pulse position is therefore referred to as a "data eye."

When sampling data, it is best that the sampling occur as close as possible to the center of the data eye, as far as possible from the transitions, because sampling during a transition could provide a false reading of the data. This is relatively easy when the clock is sent along with the data. However, when the clock must be recovered from the data, clock recovery errors could make centering the sampling time in the data eye—"eye centering"—difficult or unreliable. Any such problems are compounded in a programmable logic device, where the circuit paths, as well as the clock recovery circuitry, differ from one user logic design to the next.

Clock recovery is commonly accomplished using a loop circuit—i.e., a phase-locked loop (PLL) or delay-locked loop (DLL)—in which a phase detector detects a phase variation between input and recovered signals, causing a charge pump to vary a control signal (i.e., voltage or current) of an oscillator (e.g., a voltage-controlled oscillator or current-controlled oscillator) to bring the recovered signal back into line with the input signal. Variation or ripple in the control signal may cause unacceptable jitter in the oscillator output, giving rise to clock recovery errors, thereby causing eye centering errors which in turn result in data read errors.

Known phase detectors contribute to jitter in different ways. For example, a full-rate linear phase detector, such as a Hogge phase detector, operates predictably but its performance degrades as the clock rate increases. A nonlinear phase detector such as a Bang Bang phase detector causes a large ripple on the control signal making the loop circuit output unpredictable. A half-rate linear phase detector is linear, therefore predictable, but produces a DOWN (or REFERENCE) signal having twice the pulse width of the UP (or ERROR) signal, resulting in a large ripple effect on the oscillator control signal.

It would be desirable to be able to provide a phase detection method and circuitry that minimizes jitter in a recovered clock application, thereby improving data reading.

SUMMARY OF THE INVENTION

The present invention minimizes jitter in a recovered clock application by providing a phase detector, for use in a clock recovery circuit, that is linear—and therefore predictable, that operates at half the clock rate—and whose performance therefore does not degrade as quickly at high speeds, and that produces UP and DOWN control pulses of equal width—thereby minimizing control signal ripple. This is achieved by using a quadrature clock to retime the data, and deriving different portions of the UP and DOWN control pulses from different quadrature phases of the retimed data.

Specifically, a quadrature clock preferably is derived from the recovered clock. In other words, four clock signals are derived from the recovered clock—the recovered clock itself, the recovered clock delayed 90°, the recovered clock delayed 180°, and the recovered clock delayed 270°. Each phase of the quadrature clock is used to retime the data and to derive a component of one of the UP and DOWN control signals from that retimed data. In one preferred embodiment, the control signal components are an UP signal component based on odd data transitions, an UP signal component based on even data transitions, a DOWN signal component based on odd data transitions, and a DOWN signal component based on even data transitions. The UP signal components preferably are combined to provide a single UP control signal, while the DOWN signal components preferably are combined to provide a single DOWN control signal.

Therefore, in accordance with the present invention, there is provided a method for detecting phase error in a loop circuit based on relative alignment between a full-rate data signal and a clock signal derived by said loop circuit. The method includes deriving a half-rate quadrature clock from the derived clock signal, comparing respective phases of the half-rate quadrature clock with respective portions of the full-rate data signal to derive respective partial phase error signals, and combining respective partial phase error signals to derive at least one signal representing the phase error. A phase detector that operates according to this method, as well as a clock data recovery circuit incorporating such a phase detector, and a programmable logic device incorporating such a clock data recovery circuit, are also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides a reliable linear phase detector that operates at half the data rate but still provides UP and DOWN control pulses of substantially equal width, by using a half-rate quadrature clock. Specifically, even though the recovered clock operates at half the data rate, because a quadrature clock is derived from the recovered clock, different phases of the clock can operate on different transitions in the data. Thus, while a half-rate clock would ordinarily miss every other transition in the full-rate data signal, the different phases of the quadrature clock are able to monitor, in the aggregate, all transitions. Each phase of the quadrature clock results in a partial UP or DOWN control signal representing those transitions monitored by that phase, but the partial signals can be combined into a single UP or DOWN control signal.

The invention will now be described with reference to FIGS. 1–4.

Figure 1:
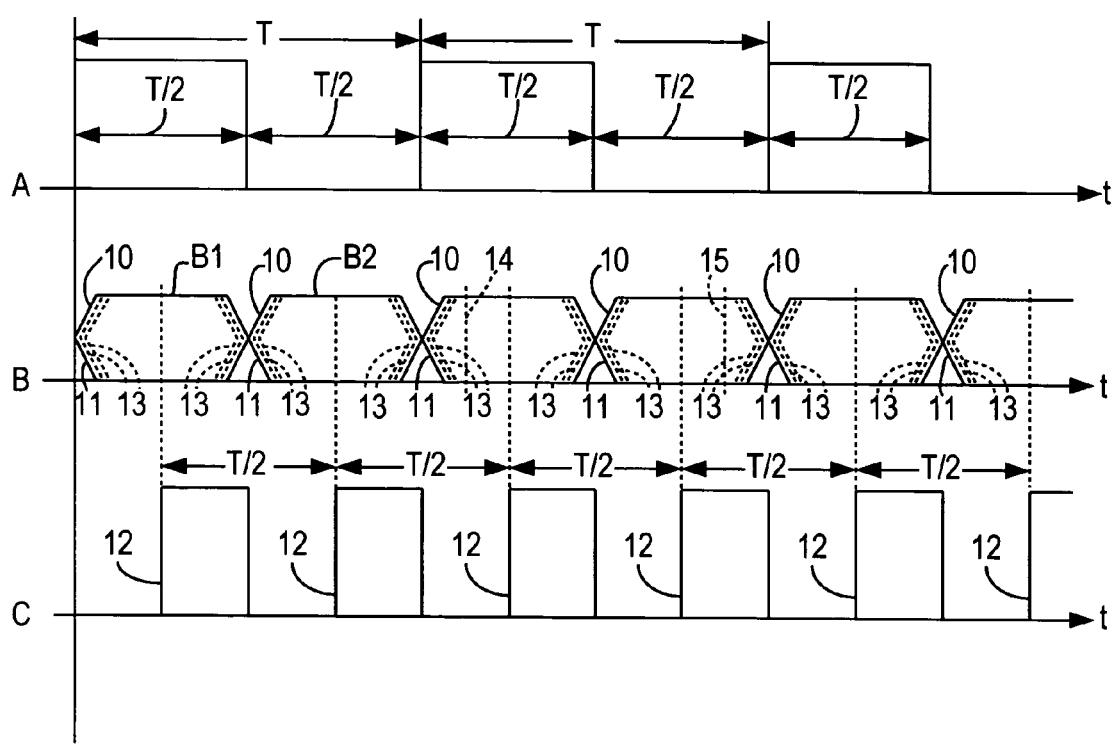
FIG. 1 is a set of timing diagrams showing clock and data signals as may be found in the present invention.

FIG. 1 shows as waveform A a clock having period T (i.e., a clock rate or frequency of 1/T). The clock signal preferably includes high intervals each of duration T/2, separated by low, or zero-amplitude, intervals also each of duration T/2 (although it is possible to imagine a clock with a different duty cycle and still with a period T). Waveform B shows a data pulse train clocked by waveform A. As discussed above, the data rate is twice the clock rate because there is no reason to separate data pulses from one another. Therefore, each T/2 slot can accommodate a data pulse. Because when the data pulse train is considered in the abstract (as opposed to particular data), it is not known whether any particular pulse will be high or low, waveform B includes the superposition of trace $B_1$ and trace $B_2$. As can be seen, the appearance of the two potential pulses in each slot, particularly in view of inclined trace portions 10, 11, is that of an eye, and is referred to as a "data eye" as mentioned above.

Waveform C is a sampling clock having the same rate as the data rate of waveform B. Each data pulse is sampled on a rising edge 12. Therefore, ideally waveform C, which is the recovered data clock, is offset from waveform A so that rising edges 12 occur in the center of each data pulse slot. If a rising edge 12 were to occur to close to transitions 10, 11, then any uncertainty in the timing of the transitions, as indicated by dashed lines 13, may cause read errors—e.g., if the transition is late, the previous value of the datum in that slot, rather than its current value, might be read if the read clock is early, as indicated by dashed line 14. The same may occur if the read clock is late, as indicated by dashed line 15. Therefore, it is important to be able to adjust the read clock so that it falls in the center of each data eye.

Figure 2:
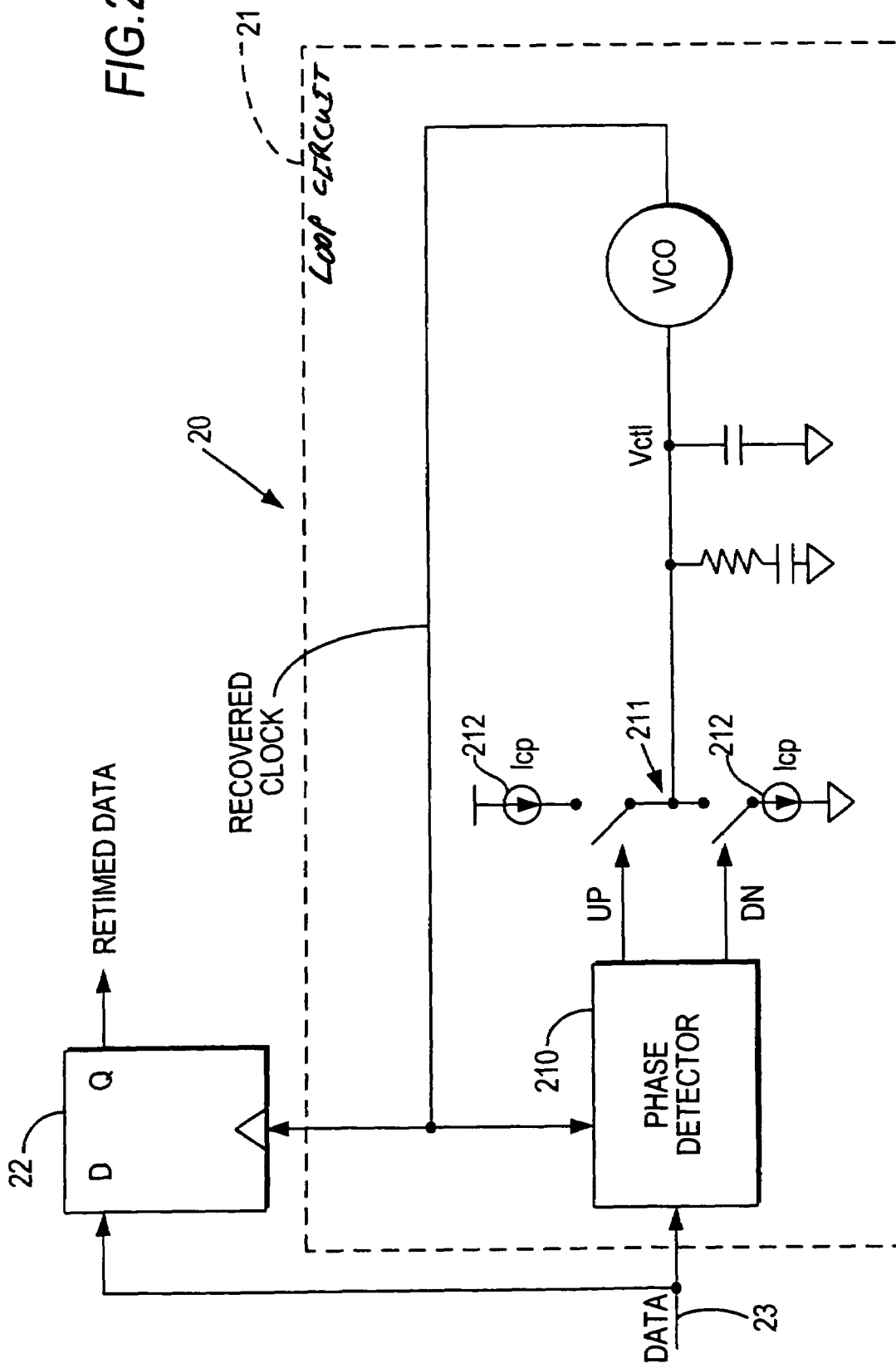
FIG. 2 is a simplified schematic diagram of a clock data recovery circuit with which the present invention may be used.

FIG. 2 shows a clock data recovery ("CDR") circuit 20 with which the present invention may be used. CDR circuit 20 preferably includes a loop circuit 21 (such as a phase-locked loop circuit, shown) and a decision circuit 22, which may be as simple as a D-type flip-flop (shown). As seen, data is input at 23 to both phase detector 210 of loop circuit 21 and to decision circuit 22, which is timed by the clock recovered from the data by loop circuit 21. The present invention provides an improved phase detector 210, which can help improve clock-data alignment.

Figure 3:
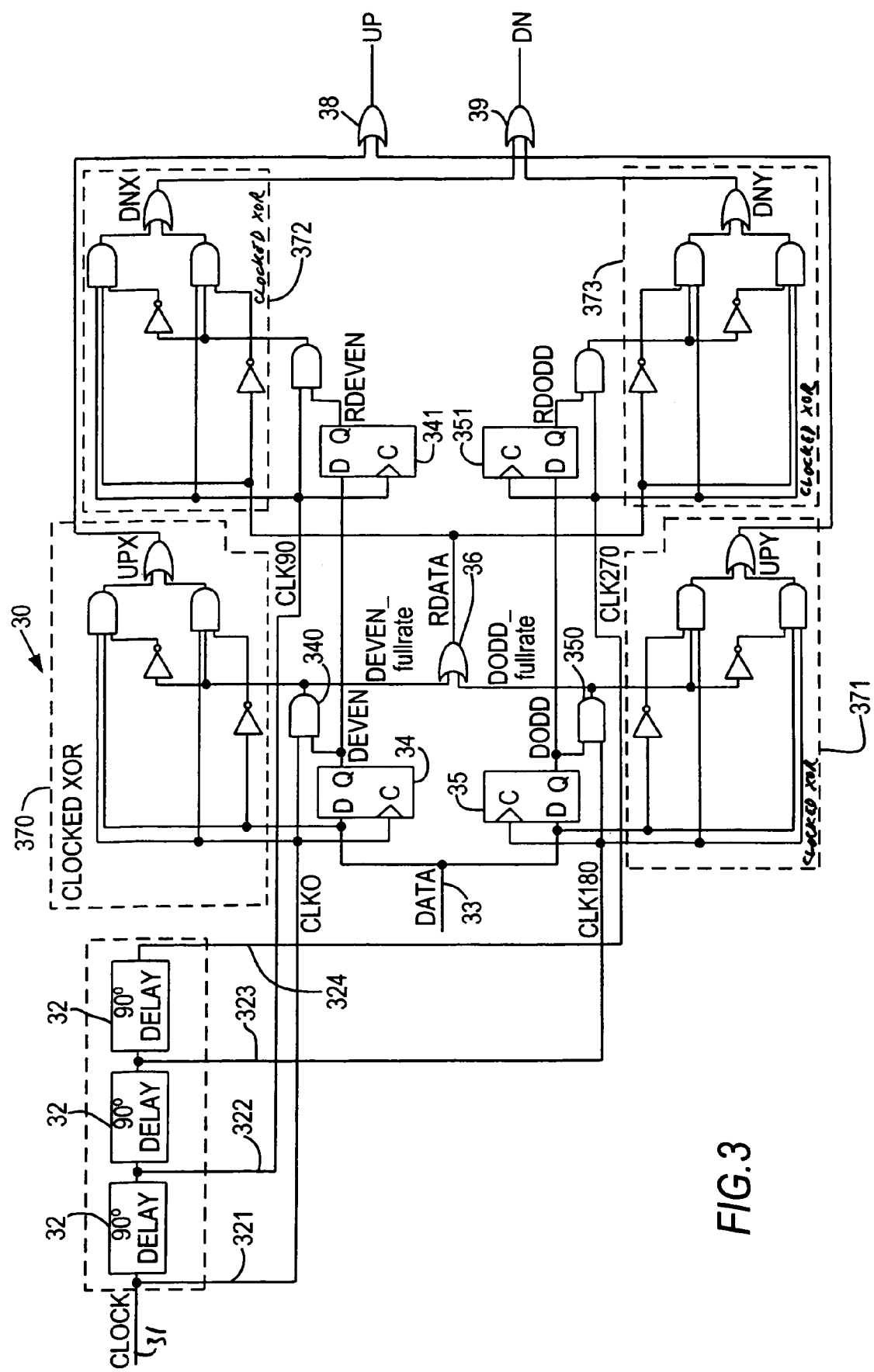
FIG. 3 is a schematic diagram of a preferred embodiment of a phase detector in accordance with the present invention.
Figure 4:
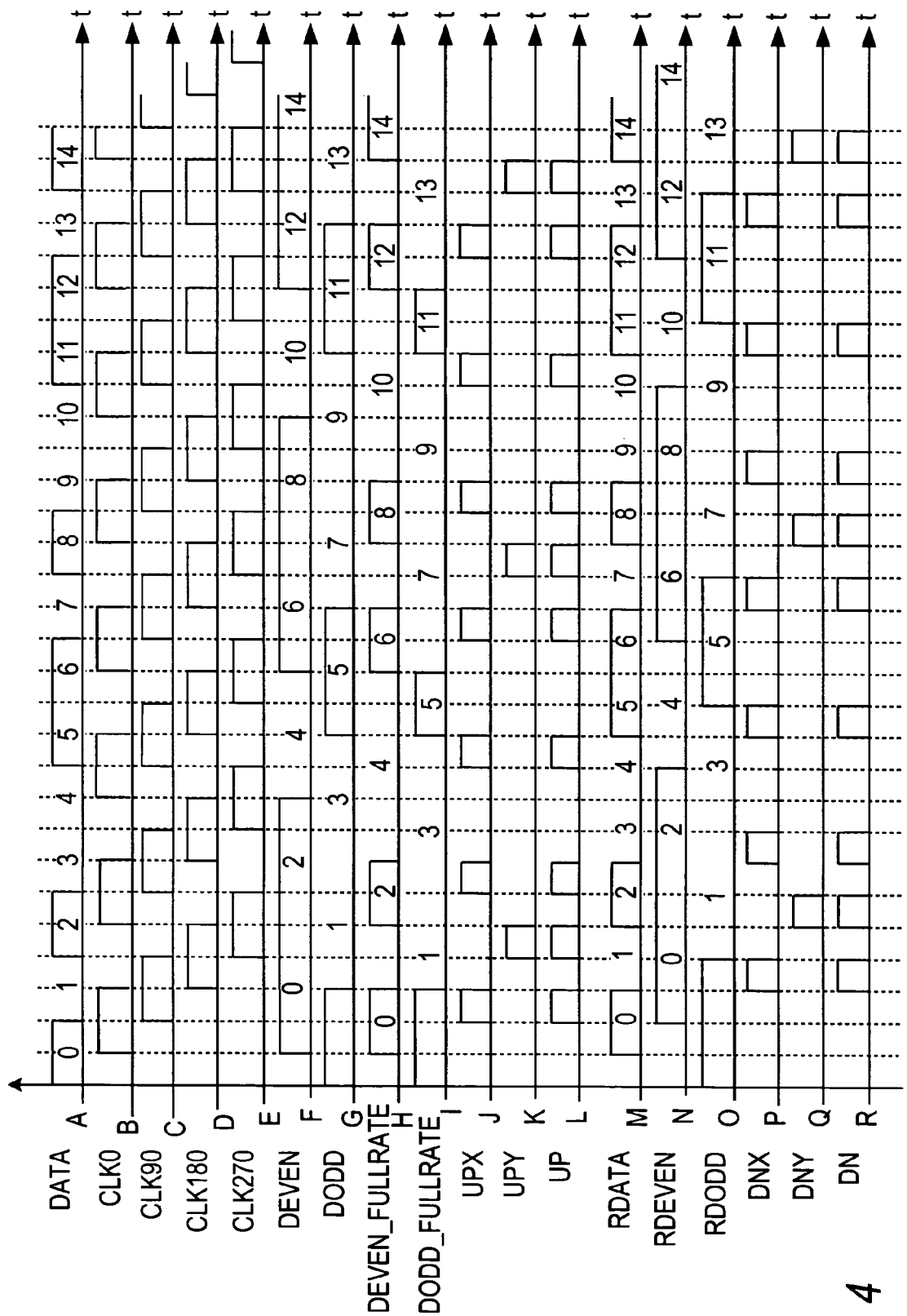
FIG. 4 is a set of waveforms illustrating the operation of the phase detector of FIG. 3.

FIG. 3 shows a preferred embodiment 30 of an improved phase detector according to the present invention, while FIG. 4 shows timing diagrams illustrating the operation of phase detector 30.

In phase detector 30, a quadrature clock is generated or derived from the input (recovered) clock 31. For example, a series of delay lines 32 can be provided, with the different phases being tapped at taps 321, 322, 323, 324. As seen in FIG. 4 (waveforms B–E), and as in FIG. 1, the clock rate is half the data rate.

The input data 33 preferably are input to two D-type flip-flops 34, 35, clocked by the undelayed clock phase, CLK0, and the 180°-delayed clock phase, CLK180, respectively. Because the respective outputs DEVEN (even data) and DODD (odd data) change only if DATA changes during a rising edge of the respective clock phase, DEVEN and DODD are as shown by waveforms F and G. DEVEN and DODD are ANDed with their respective clock phases in respective AND-gates 340, 350 to produce, respectively, DEVEN_fullrate and DODD_fullrate (waveforms H and I), which together carry the full-rate data. DEVEN_fullrate and DODD_fullrate are combined in OR-gate 36 to provide retimed data RDATA (waveform M), which is used as described below. Each of DEVEN_fullrate and DODD_fullrate also is combined with the original DATA by respective "Clocked Exclusive-OR" circuit 370, 371, in which the exclusive-OR function is clocked by the respective quadrature clock phase. The output of clocked exclusive-OR circuit 370 is UPX (waveform J), and the output of clocked exclusive-OR circuit 371 is UPY (waveform K). It can be seen that UPX goes high whenever there is a transition in DATA between an even-numbered time slot and an odd-numbered time slot, while UPY goes high whenever there is a transition in DATA between an odd-numbered time slot and an even-numbered time slot. The combined phase detector UP signal (waveform L) is the sum, or OR, of UPX and UPY as provided by OR-gate 38.

The even and odd data signals DEVEN and DODD preferably are input to two D-type flip-flops 341, 351, clocked by the 90°-delayed clock phase, CLK90, and the 270°-delayed clock phase, CLK270, respectively, resulting, respectively, in retimed even data RDEVEN (waveform N) and retimed odd data RDODD (waveform O). Each of RDEVEN and RDODD is combined with the retimed data RDATA by respective "Clocked Exclusive-OR" circuit 372, 373, in which the exclusive-OR function is clocked by the respective quadrature clock phase. The output of clocked exclusive-OR circuit 372 is DNX (waveform P), and the output of clocked exclusive-OR circuit 373 is DNY (waveform Q). It can be seen that DNX goes high whenever there is a transition in RDATA between an even-numbered time slot and an odd-numbered time slot, while DNY goes high whenever there is a transition in RDATA between an odd-numbered time slot and an even-numbered time slot. The combined phase detector DN signal (waveform R) is the sum, or OR, of DNX and DNY as provided by OR-gate 39.

A comparison of the UP and DN signals shows that they are balanced—each UP pulse is followed by a DN pulse—and the UP and DN pulses are of equal width. Thus, when phase detector 30 is used in clock data recovery circuit 20, there is very little ripple in the oscillator control voltage. Moreover, because phase detector 30 is linear, its output is predictable.

Figure 5:
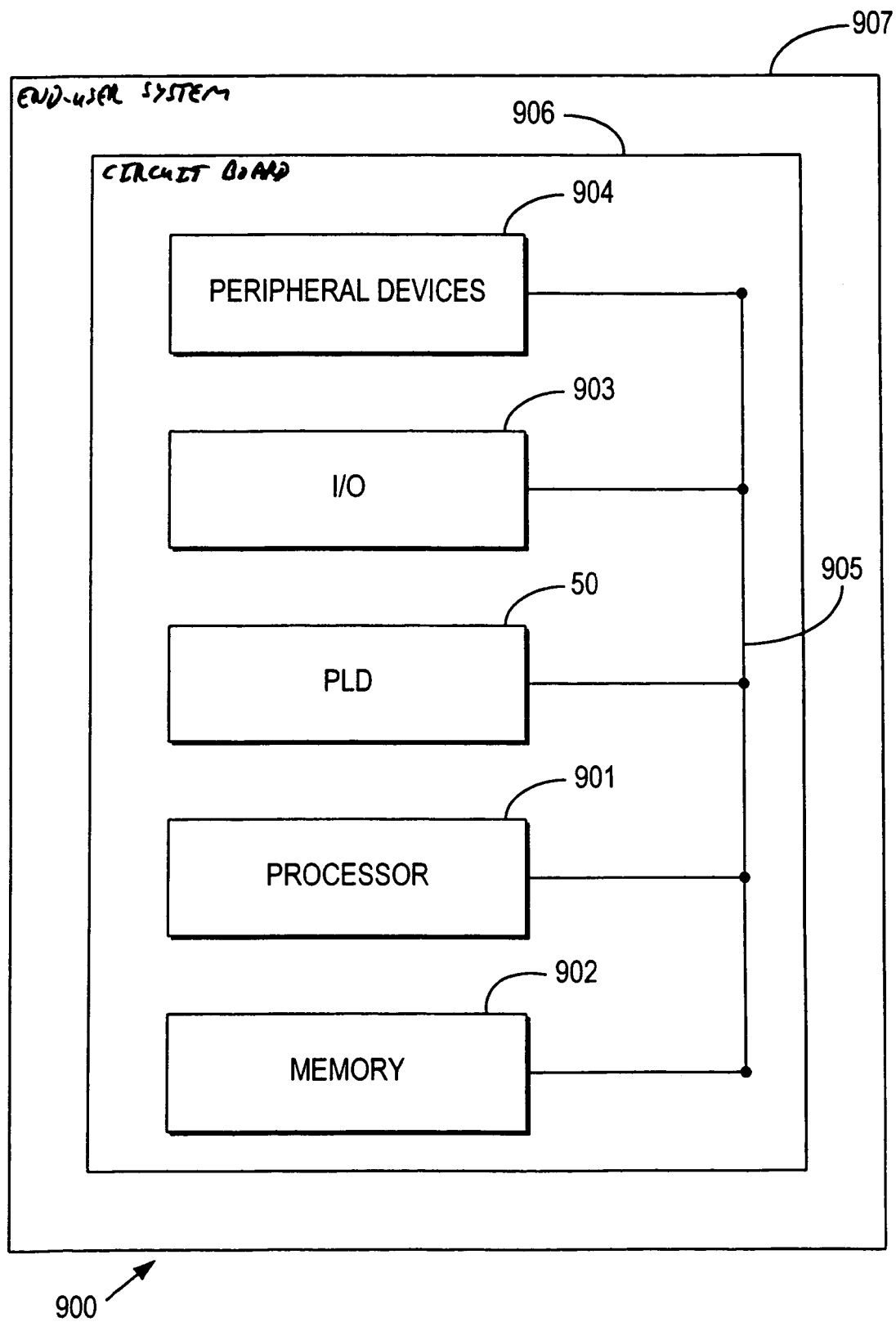
FIG. 5 is a schematic representation of a system including a programmable logic device incorporating the present invention.

A programmable logic device ("PLD") 50 incorporating clock data recovery circuitry according to the present invention may be used in many kinds of electronic devices. One possible use is in a data processing system 900 shown in FIG. 5. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 50 can be used to perform a variety of different logic functions. For example, PLD 50 can be configured as a processor or controller that works in cooperation with processor 901. PLD 50 may also be used as an arbiter for arbitrating access to a shared resources in system 900. In yet another example, PLD 50 can be configured as an interface between processor 901 and one of the other components in system 900. It should be noted that system 900 is only exemplary, and that the true scope and spirit of the invention should be indicated by the following claims.

Various technologies can be used to implement PLDs 50 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A phase detector for providing an UP control signal and a DOWN control signal in a high-speed loop circuit based on relative alignment between a full-rate data signal and a clock signal derived by said loop circuit, said phase detector comprising:
    circuitry for deriving a half-rate quadrature clock from said derived clock signal;
    circuitry for comparing a first quadrature phase of said half-rate quadrature clock with even pulses of said data signal to derive a first portion of said UP control signal;
    circuitry for comparing a second quadrature phase of said half-rate quadrature clock with odd pulses of said data signal to derive a second portion of said UP control signal;
    circuitry for comparing a third quadrature phase of said half-rate quadrature clock with even pulses of said data signal to derive a first portion of said DOWN control signal;
    circuitry for comparing a fourth quadrature phase of said half-rate quadrature clock with odd pulses of said data signal to derive a second portion of said DOWN control signal;
    circuitry for combining said first and second portions of said UP control signal into a single UP control signal; and
    circuitry for combining said first and second portions of said DOWN control signal into a single DOWN control signal.

2. The phase detector of claim 1 wherein each said respective circuitry for comparing comprises a clocked exclusive-OR circuit, clocked by the respective quadrature phase being compared by said respective circuitry for comparing.

3. The phase detector of claim 1 wherein each respective circuitry for comparing comprises a respective OR gate.

4. A method for providing an UP control signal and a DOWN control signal in a phase detector of a loop circuit based on relative alignment between a full-rate data signal and a clock signal derived by said loop circuit, said method comprising:
    deriving a half-rate quadrature clock from said derived clock signal;
    comparing a first quadrature phase of said half-rate quadrature clock with even pulses of said data signal to derive a first portion of said UP control signal;
    comparing a second quadrature phase of said half-rate quadrature clock with odd pulses of said data signal to derive a second portion of said UP control signal;
    comparing a third quadrature phase of said half-rate quadrature clock with even pulses of said data signal to derive a first portion of said DOWN control signal;
    comparing a fourth quadrature phase of said half-rate quadrature clock with odd pulses of said data signal to derive a second portion of said DOWN control signal;
    combining said first and second portions of said UP control signal into a single UP control signal; and
    combining said first and second portions of said DOWN control signal into a single DOWN control signal.

5. A method for detecting phase error in a loop circuit based on relative alignment between a full-rate data signal and a clock signal derived by said loop circuit, said method comprising:
    deriving a half-rate quadrature clock from said derived clock signal;
    comparing first and second phases of said half-rate quadrature clock with respective portions of said full-rate data signal to derive respective partial UP phase error signals;
    comparing third and fourth phases of said half-rate quadrature clock with respective portions of said full-rate data signal to derive respective partial DOWN phase error signals; and
    combining said respective partial phase error signals to derive at least one signal representing said phase error.

6. The method of claim 5 wherein said combining comprises:
    combining a first component of said respective partial phase error signals into a single UP control signal; and
    combining a second portion component of said respective partial phase error signals into a single DOWN control signal.

7. The method of claim 5 wherein:
    said comparing first and second phases of said half-rate quadrature clock with respective portions of said full-rate data signal to derive respective partial UP phase error signals comprises:
        comparing a first quadrature phase of said half-rate quadrature clock with even pulses of said data signal to derive a first component of an UP control signal, and
        comparing a second quadrature phase of said half-rate quadrature clock with odd pulses of said data signal to derive a second component of said UP control signal; and
    said comparing third and fourth phases of said half-rate quadrature clock with respective portions of said full-rate data signal to derive respective partial DOWN phase error signals comprises:
        comparing a third quadrature phase of said half-rate quadrature clock with even pulses of said data signal to derive a first component of a DOWN control signal; and
        comparing a fourth quadrature phase of said half-rate quadrature clock with odd pulses of said data signal to derive a second component of said DOWN control signal.

8. The method of claim 7 wherein said combining comprises:
    combining said first and second components of said UP control signal into a single UP control signal; and
    combining said first and second components of said DOWN control signal into a single DOWN control signal.

\* \* \* \* \*